(12) United States Patent
Xu et al.

(10) Patent No.: US 7,361,883 B2
(45) Date of Patent: Apr. 22, 2008

(54) PHOTONIC MIXER DEVICE

(75) Inventors: Zhanping Xu, Netphen (DE); Tobias Möller, Großenlüder (DE); Holger Kraft, Siegen (DE); Jochen Frey, Wetzlar (DE); Martin Albrecht, Siegen (DE)

(73) Assignee: PMD Technologies GmbH, Siegen (DE)

( * ) Notice: Subject to any disclaimer, the term of this patent is extended or adjusted under 35 U.S.C. 154(b) by 109 days.

(21) Appl. No.: 11/098,728

(22) Filed: Apr. 4, 2005

(65) Prior Publication Data

US 2005/0237811 A1 Oct. 27, 2005

(30) Foreign Application Priority Data

Apr. 5, 2004 (DE) .................... 10 2004 016 624

(51) Int. Cl.
*H01L 31/00* (2006.01)
(52) U.S. Cl. ................................. 250/214.1
(58) Field of Classification Search ............ 250/214.1, 250/214 R
See application file for complete search history.

(56) References Cited

U.S. PATENT DOCUMENTS 6,777,659 B1 *  8/2004  Schwarte ................ 250/208.1
6,825,455 B1 * 11/2004  Schwarte ................ 250/214.1
2003/0057388 A1 *  3/2003  Imai et al. ................ 250/586

FOREIGN PATENT DOCUMENTS

| DE | 197 04 496 C2 | 2/2001 |
| DE | 102 30 225 A1 | 1/2004 |
| WO | WO 98 10255 A1 * | 3/1998 |
| WO | WO 2004/027359 A1 | 9/2002 |

* cited by examiner

Primary Examiner—Thanh X Luu
(74) Attorney, Agent, or Firm—Paul & Paul

(57) ABSTRACT

The present invention relates to a photonic mixer device with a photosensitive layer, at least two modulation gates (3, 4, 103, 104, 203, 204, 303, 304, 403, 404) and at least two readout electrodes (1, 2, 101, 102, 201, 202, 301, 302, 401, 402, 501, 502, 601, 602) connected to the photosensitive layer, the modulation gates (3, 4, 103, 104, 203, 204, 303, 304, 403, 404) being able to be connected to a modulation device which raises and lowers the potential of the modulation gates relative to one another and relative to the preferably constant potential of the readout electrodes corresponding to a desired modulation function. In order to further develop the known photonic mixer device such that it shows an increased charge conversion efficiency and reduced dark currents, it is proposed according to the invention that the readout electrodes (1, 2, 101, 102, 201, 202, 301, 302, 401, 402, 501, 502, 601, 602) in each case have at least two discrete electrode sections (1A-1E, 2A-2E) arranged at a distance alongside each other.

19 Claims, 5 Drawing Sheets

PHOTONIC MIXER DEVICE

BACKGROUND OF THE INVENTION:

The present invention relates to a photonic mixer device with a photosensitive layer, at least two modulation gates and at least two readout electrodes connected to the photosensitive layer, the modulation gates being able to be connected to a modulation device which raises and lowers the potential of the modulation photogates relative to one another and relative to the preferably constant potential of the readout electrodes corresponding to a desired modulation function.

Photonic mixer devices and a method for recording amplitude and phase of an electromagnetic wave are known from the state of the art, for example from DE 198 21 974 A1. The measurement principle known from the state of the art uses a photodetector with a photosensitive layer in which incident photons produce charge carriers and two readout electrodes or readout gates which make it possible to read from the detector a current or voltage signal proportional to the number of incident photons. In addition, modulation gates are provided close to the readout electrodes which are biased with a modulated voltage in order to drive the charge carriers produced in the photosensitive layer to the readout electrodes. A modulated voltage signal is applied to the modulation gates which is correlated with the modulation which was impressed beforehand as intensity modulation on the electromagnetic radiation to be detected. Generally speaking, for practical reasons, the intensity modulation of the incident electromagnetic radiation and the modulation of the modulation gates show the same frequency. The decisive factor is that not only do the modulation of the electromagnetic radiation and the modulation voltage of the modulation gates show the same frequency, but the signals are also coupled phase-locked to one another. The modulation signal can follow a cosine-shaped pattern, but can also have any other periodic or quasi-periodic structure. Therefore, the signal applied to the modulation gates can also be called reference signal. The reference signals which are passed to the two modulation gates display a phase displacement of 180° relative to each other, with the result that the modulation gates cause a potential gradient in the photonic mixer device that drives the produced charge carriers to one or the other readout electrode. The voltage or current signal measured via the readout electrodes is a function of the product of the number of generated charge carriers and the modulation or reference voltage. The measured signal is then essentially proportional to the intensity of the incident electromagnetic wave and its phase displacement in relation to the modulation voltage. If the quadrature component of the incident electromagnetic wave is measured simultaneously with a second mixer element, expediently on the same photonic mixer device, the amplitude and phase information of the incident electromagnetic signal is obtained directly from the two values read from the mixer elements. For this, the modulation voltages applied to the modulation gates of the second mixer element must display a phase displacement of 90° relative to the modulation voltages of the first mixer element.

Corresponding photonic mixer devices are known from the German patent application DE 198 21 974 A1 and reference is made to the complete disclosure of this prior application in as much as the basic mode of operation, the structure and the possible uses of the photonic mixer devices are described therein. The photonic mixer devices disclosed in DE 198 21 974 A1 have at least two modulation gates and at least two readout electrodes in the form of long and narrow, parallel strips. The strip form of the gates or electrodes makes it possible to keep the gate lengths, i.e. the dimension of the gates in the direction of the charge carrier movement, as small as possible and at the same time provide a sufficiently large surface area for the production of charge carriers by the incident electromagnetic radiation. A sufficiently high efficiency of the photonic mixer devices can thus also be achieved for short gate lengths.

The readout electrodes generally have metal contacts which are vaporized or sputtered directly onto the photosensitive layer. The photosensitive layer consists of a semiconductor material, for example p- or n-doped silicon. The semiconductor material is doped complementarily to the remaining wafer in the area beneath the contacts. Thus the readout electrodes are formed by pn diodes. However, photonic mixer devices are also known from the state of the art in which the metal contacts are applied to an intrinsic or continuously doped semiconductor material. The readout electrodes then, because of the metal-semiconductor transition, also display a diode-like, non-ohmic characteristic.

It proves disadvantageous that the readout diodes or diode-like readout electrodes in strip form known from the state of the art display a great capacity which limit the charge conversion efficiency (CCE) when using voltage measurement. The term charge conversion efficiency is used to describe the voltage rise per charge carrier produced in the photosensitive material.

In addition, because of their diode characteristic, the strip-shaped readout electrodes used have the disadvantage that they show increased thermal dark currents, by which the use of a current-measurement method is also affected.

Compared with this state of the art, the object of the present invention is to further develop the known photonic mixer device so that it shows an increased charge conversion efficiency and reduced dark currents.

SUMMARY OF THE INVENTION

The present object is achieved in that a photonic mixer device with a photosensitive layer, at least two modulation gates and at least two readout electrodes connected to the photosensitive layer is provided, the modulation gates being able to be connected to a modulation device which raises and lowers the potential of the modulation photogates relative to one another and relative to the preferably constant potential of the readout electrodes corresponding to a desired modulation function, the readout electrodes in each case having at least two discrete electrode sections arranged at a distance alongside each other.

The charge conversion efficiency of the photonic mixer device in the voltage-measurement operation is proportional in good approximation to the reciprocal of the capacity of the readout electrodes. The capacity of the readout electrodes is, just like the produced dark current, a function of the surface area of the readout electrodes. This applies both to the capacity of the metal-semiconductor transitions between the metal contacts and the substrate and to the capacity of pn transitions in the readout electrodes. Through the use of at least two discrete electrode sections arranged at a distance alongside each other instead of the continuous strip-shaped readout electrode, the overall surface area of the electrode is reduced and its capacity thus reduced.

The overall length of the readout electrode preferably corresponds to the length of the one-piece readout electrodes known from the state of the art.

It is expedient if the electrode sections of the readout electrodes are arranged in a row next to each other. The arrangement of several electrode sections next to each other permits an efficient trapping of charge carriers in the electrode with a reduced capacity of the electrode. For an efficient reading of the readout electrode, the individual electrode sections must be electrically connected to each other, but the electric connection between the individual electrode sections should not form a direct electric connection to the photosensitive layer, as otherwise the advantages of the discrete electrode sections would be destroyed.

A version of the invention is particularly preferred in which the readout electrodes have metal contacts, preferably of aluminium. These can be vaporized or sputtered directly onto the photosensitive layer.

The readout electrodes are preferably designed as pn diodes, the photosensitive layer or the substrate in the area beneath the contacts of the readout electrodes being p- or n-doped complementarily to the doping of the remaining substrate.

A version of the invention is preferred in which the discrete electrode sections of the readout electrodes is at most three times, preferably at most twice, their width and particularly preferably equal to their width. The width of the discrete electrode sections is 0.5 to 5 micrometres, preferably 1 to 3 micrometres and particularly preferably 1.8 micrometres.

A version of the invention is preferred in which the individual electrode sections of a readout electrode have a distance between their lateral edges of between 2 micrometres and 10 micrometres, preferably between 4 micrometres and 8 micrometres and particularly preferably 6 micrometres.

It is furthermore expedient if the metal contacts of the readout electrodes have a T-shaped cross-section, with the result that they project partly over the adjoining material layers. The metal contacts designed in this way have an adequate size for establishing contact, while their contact surface to the photosensitive material is as small as possible.

Such a structure can be produced efficiently in the CMOS technology known from the state of the art. However, versions in other technologies, e.g. on GaAs are also advantageous and possible without restriction of function.

A version of the present invention is particularly preferred in which the modulation gates are essentially strip-shaped, i.e. longer than they are wide. They extend parallel to the discrete electrode sections, arranged in a row, of the readout electrodes.

It is expedient if the modulation gates are transparent for the incident electromagnetic radiation, with the result that the radiation incident on the detector passes through the modulation gates to strike the photosensitive layer lying beneath them. The modulation gates can be formed both from a transparent p- or n-doped semiconductor layer and from a transparent metal layer.

It is advantageous if the modulation gates are electrically separated from the photosensitive layer with the help of an insulation layer, preferably an oxide layer. The influence on the charge carriers produced under the insulation layer in the photosensitive layer is thus maintained, without their being able to be trapped by the modulation gates.

A version of the invention is preferred in which the electrode sections of a readout electrode spatially adjoin the modulation gates, being electrically isolated from them. An efficient trapping of charge carriers by the readout electrodes can thereby be achieved.

A version is particularly preferred in which the modulation gates are made from p- or n-doped semiconductor material.

It is expedient if the readout electrodes are surrounded by an insulating layer on the sides which do not adjoin the modulation gates.

A version of the present invention is particularly preferred in which the electrode sections of a readout electrode are spatially arranged in the area of the modulation gates, being electrically isolated from them. The charge carriers can thus flow from at least three sides onto the electrode sections of the readout electrodes.

A version of the invention is preferred in which the individual electrode sections of a readout electrode display a distance between their lateral edges of between 2 micrometres and 10 micrometres, preferably between 4 micrometres and 8 micrometres and partially preferably 6 micrometres. The quoted distances permit an efficient collection of the charge carriers on the individual electrode sections of the readout electrodes.

A particularly compact version of the photonic mixer device according to the invention is obtained if two neighbouring mixer elements of the detector have a common readout electrode. The electrode sections of the common readout electrode can either be arranged spatially in the area of a common modulation gate of the two detectors or spatially adjoin two separate modulation gates of the two detectors.

A version of the present invention is particularly preferred in which at least two additional memory gates are provided which surround the readout electrodes. The memory gates are preferably electrically isolated from the readout electrodes and provided with an electric bias voltage. The memory gates form at least two potential wells surrounding the readout electrodes in which the charge carriers produced by the electromagnetic radiation gather after passing through the potential gradient produced by the modulation gates. If a semiconductor, such as silicon, is used as photosensitive layer, it is sufficient to provide the memory gates with a positive bias voltage, with the result that a potential well for the electrons determining the current flow is produced.

The memory gates are preferably covered by a layer that is not transparent for the incident electromagnetic radiation, with the result that no charge carriers are produced in the area of the memory gates. Furthermore, it is expedient if the electrode sections of the readout electrodes are electrically isolated from the memory gates.

Through the combination of the discrete electrode sections of the readout electrodes with the preferably strip-shaped memory gates surrounding them, the advantages of the strip-shaped readout electrodes from the state of the art are combined with those of the discrete electrode sections of the readout electrodes according to the invention. The strip-shaped readout electrodes from the state of the art make possible an efficient charge carrier efflux, as all the photo-produced charge carriers, which, because of the electric field, are accelerated in a direction perpendicular to the strip-shaped readout electrodes, strike the readout electrodes and can flow onto these. Similarly to the strip-shaped readout electrodes, the memory gates according to the invention also gather in all the charge carriers accelerated in a direction perpendicular to the strips. Reading then takes place with the help of the discrete electrode sections of the readout electrodes which display a smaller reading capacity than the strip-shaped readout electrodes known from the state of the art. The trapping of the charge carriers from the memory gates in the readout electrodes is also very efficient.

Moreover, the photonic mixer devices according to the invention with memory gates have a two-stage charge conversion efficiency depending on the illumination intensity. If the illumination intensity is low, and there are few photo-generated charge carriers, the integrating capacity of the detector is equal to the intrinsic capacity of the metal-semiconductor contacts or of the pn diodes of the readout electrodes. If the readout electrodes reach the potential of the memory gates though afflux of charge carriers, the integrating capacity of the detector is equal to the sum of the intrinsic capacity of the readout electrodes and the capacity of the memory gates. The described procedure leads, for low intensities of the incident electromagnetic radiation, to a high sensitivity or charge conversion efficiency, whereas for high intensities (many photo-generated charge carriers) the charge conversion efficiency assumes a second lower value. As the sensitivity is reduced for high intensities, the photonic mixer device according to the invention, compared with the detectors without memory gates, reaches a saturation only at higher intensities, with the result that the dynamic range of the photonic mixer device is improved. By adapting the bias voltage of the memory gates, the threshold value for reaching the reduced conversion efficiency can be freely set.

The memory gates provided with a constant bias voltage reduce the side-to-side crosstalk between the modulation gates and the readout electrodes of the photonic mixer device. In this way, a possible disturbance of the readout electrodes because of the modulation signal is minimized. Ideally, there is a complete uncoupling of the readout diodes from high-frequency disturbances. The memory gates can therefore also be called "separation gates".

A particularly compact design is achieved when using a common memory gate for two neighbouring mixer elements of the detector.

A version of the invention is particularly preferred in which the photonic mixer device has at least one additional memory structure. The memory structure is expediently constructed from at least one readout electrode with a memory gate surrounding it, the readout electrodes being constructed from discrete electrode sections electrically connected to each other, the electrode sections of the readout electrodes being electrically isolated from the memory gates, the memory structure being covered by a layer that is not transparent for electromagnetic waves and the readout electrodes of the memory structure being electrically connected to at least one readout electrode of a mixer element.

It is advantageous if the memory gates of the memory structures lie on a potential between the potential of the memory gates of the mixer elements and the potential of the readout electrodes of the mixer elements.

The storage structure according to the invention extends the principle, described previously for the memory gates, of a two-stage charge conversion efficiency by adding the additional capacity of the memory structure to a three-stage conversion efficiency. Thus a photonic mixer device with three-stage sensitivity is provided which has a further improved dynamic range.

It is expedient if exactly two memory structures are provided per detector element, the readout electrodes of which are each connected to a readout electrode of the detector element. An extension of the dynamic range of the detector element can thus be achieved.

Moreover, it may be expedient if two neighbouring mixer elements on the same photonic mixer device have a common memory structure.

A version of the invention is particularly preferred in which the photonic mixer device has more than one mixer element. The mixer elements can be connected such that their signals are added together, but they can also be supplied with modulation signals that have been displaced by 90°, with the result that the quadrature components for determining the phase of the incident electromagnetic signal can be recorded in one measurement.

BRIEF DESCRIPTION OF THE DRAWINGS:

Further features, advantages and application possibilities of the present invention become clear with the help of the following description of a preferred version.

Figure 1:
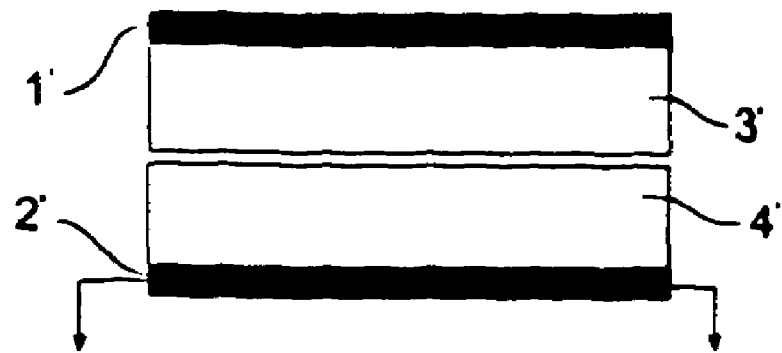
FIG. 1 shows a view from above onto a detector element from the state of the art with strip-shaped readout electrodes.

DETAILED DESCRIPTION OF THE INVENTION:

FIG. 1 shows a view from above onto a photonic mixer device such as is known from the state of the art. The two readout electrodes 1', 2' and also the modulation gates 3', 4' of the detector element are clearly recognizable. What the drawing does not show is that a photosensitive layer made of silicon is arranged beneath the gates 1', 2', 3' 4'. In operation, the readout electrodes 1', 2' are provided with a positive bias voltage, with the result that the electrodes or gates act as potential well for the charge carriers produced in the photosensitive layer. The positive bias voltage is chosen as, because of the lower mobilities of the holes, its contribution to the current transport is negligible. A reference voltage $U_{ref}$ is applied to the modulation gates 3', 4', the modulation of which is identical with the modulation of the incident electromagnetic radiation. The modulation of the electromagnetic radiation and the modulated voltage of the modulation gates 3', 4' can display a phase displacement $\phi$. Upon illumination with the intensity-modulated radiation, charge carriers are produced in the photosensitive layers which are then accelerated to the readout electrodes 1', 2' in the potential gradient which is caused by the modulation gates 3', 4'. It is necessary that the two modulation gates are biased with an opposite-phase modulation signal, in order to produce a potential difference between the two areas of the photosensitive layer that lie beneath the modulation gates 3' 4'. The number of charge carriers reaching the readout electrodes 1, 2' is a function of the intensity of the incident electromagnetic radiation and of the phase difference φ. Thus the intensity of the incident electromagnetic radiation and the phase difference φ between the modulation signal of the incident electromagnetic radiation and the modulation signal of the modulation gates 3', 4' can be recorded with the help of a voltage or current measurement.

The readout electrodes 1, 2' have ohmic contacts made from aluminium which are applied directly to the semiconductor material, in the represented case p-doped silicon. In the area beneath the metal contacts, the semiconductor material is n$^+$ doped complementarily to the remaining material, with the result that the readout electrodes are formed by pn diodes. If a n-doped semiconductor material is used instead of this, the material is p-doped in the area beneath the contacts of the readout electrodes 1', 2'.

In the plan view in FIG. 1, only the bases of the complementarily doped areas of the readout electrodes are represented. The structure lying above it of the strips is of secondary importance. If the readout electrodes are to be read with a voltage measurement, the measured voltage signal is proportional to $1/C_A$, $C_A$ being the capacity of the readout electrodes. The pn transitions of the readout electrodes 1', 2' have an intrinsic capacity which essentially determines the capacity $C_A$ of the readout electrodes. In order to obtain as great as possible a voltage change due to the charge carriers produced in the photonic mixer device, the intrinsic capacity of the readout electrodes must be kept as small as possible.

Figure 2:
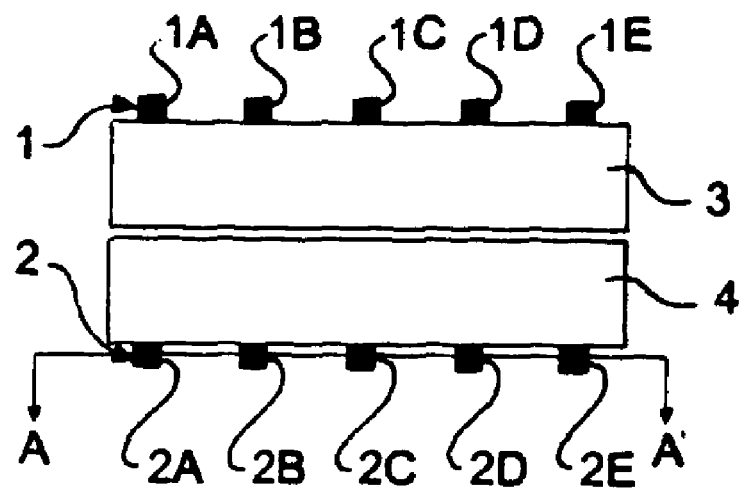
FIG. 2 shows a view from above onto a first version of the photonic mixer device according to the invention.

FIG. 2 shows a first preferred version of the photonic mixer device according to the invention, in which the readout electrodes 1, 2 are constructed from discrete electrode sections 1A-1E, 2A-2E. Thus the capacity of each readout electrode 1, 2 is smaller than that of a strip-shaped readout electrode 1', 2' with a length which essentially corresponds to the distance between the two discrete electrode sections 1A to 1E and 2A to 2E respectively that lie furthest apart. The electrodes of the readout electrodes 1, 2 directly adjoin the modulation gates spatially, being electrically isolated from the modulation gates in the version represented.

Figure 3:
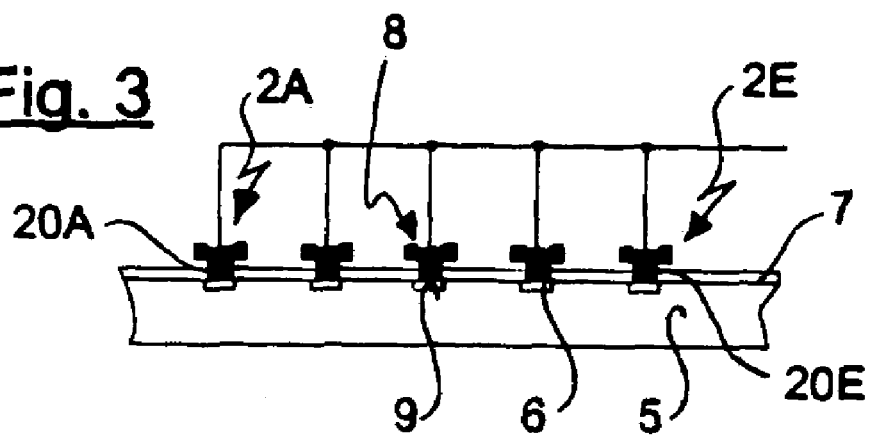
FIG. 3 shows a vertical sectional view through the photonic mixer device represented in FIG. 2, along the line A-A'.

FIG. 3 shows a sectional view along the line A-A' from FIG. 2, the section passing exactly through the discrete electrodes. The vertical structure of the electrode sections 2A-2E is clearly recognizable. The photosensitive layer is a p-doped substrate 5 made from silicon. As indicated in the sectional view in FIG. 3, in the area 8 of the electrode sections the substrate in each case has a n+ doping 6, with the result that the electrode sections 2A-2E are formed from pn diodes with metal contacts 20A-20E lying above them. If an n-doped semiconductor substrate is used instead of this, the material is p-doped in the area of the electrode sections. The ohmic contacts are applied directly to the complementarily doped region 6.

A silicon oxide layer 7 is arranged on the substrate 5 between the electrodes or around them. The contacts 20A-20E each have a T-shaped cross-section. The base 9 of the complementarily doped areas 6 of the electrode sections 2A-2E respectively is quadratic with a side length of 1.8 micrometres. It is also clear from FIG. 3 that the electrode sections, indicated in FIGS. 2 and 4 and also in the following figures, of the readout electrodes represent only the bases 9 of the complementarily doped areas 6 of the electrode sections.

Figure 2A:
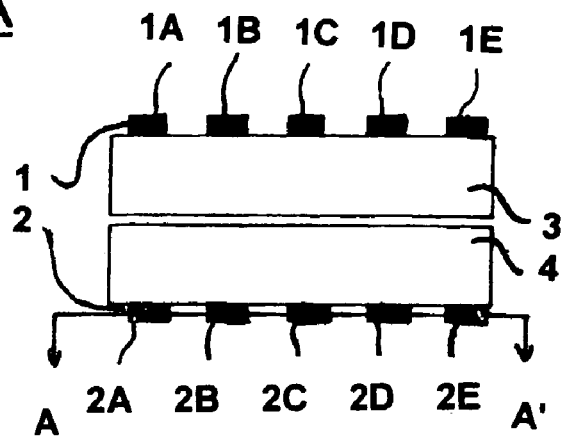
FIGS. 2A and 2B show a view from above onto a second and third versions, respectively, of the photonic mixer device according to the invention.
Figure 2B:
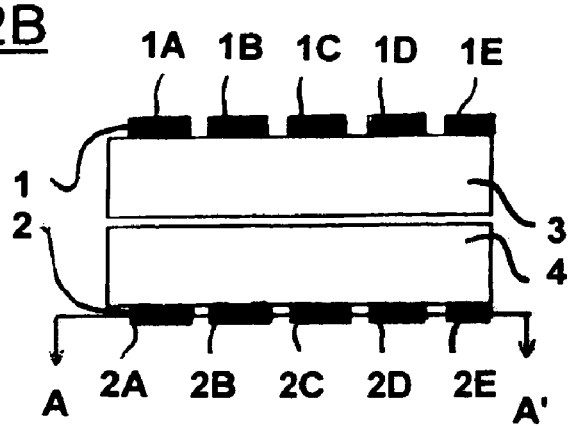

FIGS. 2A and 2B show the photonic mixer of FIG. 2 where the readout electrodes 1A-1E and 2A-2E length and width dimensions are not equal as shown in FIG. 2. In FIG. 2A the length of the readout electrodes 1A-1E and 2A-2E is twice the width. In FIG. 2B the length of the readout electrodes is three times the width.

Figure 4:
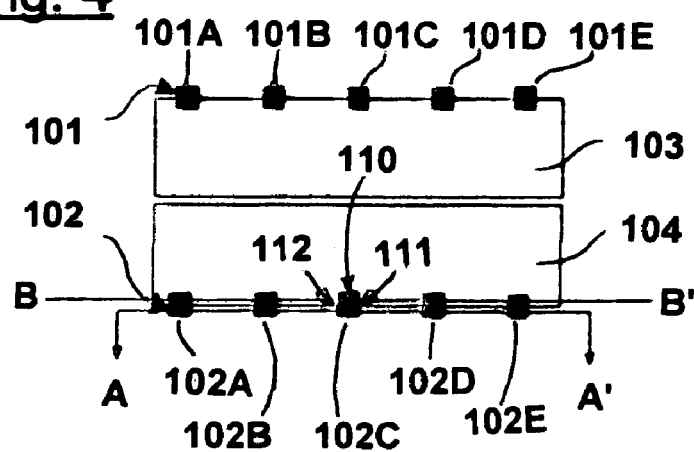
FIG. 4 shows a view from above onto a second version of the photonic mixer device according to the invention.

The arrangement shown in FIG. 4 of the discrete electrode sections 101A to 101E, 102A to 102E differs from the arrangement shown in FIG. 2 in that the electrode sections extend into the area of the modulation gates 103, 104. The modulation gates 103, 104 are electrically isolated from the readout electrodes, as before. This arrangement permits an improved flow of the charge carriers onto the electrode sections, essentially from three sides 110, 111, 112, as is indicated for the electrode 102C.

Figure 5:
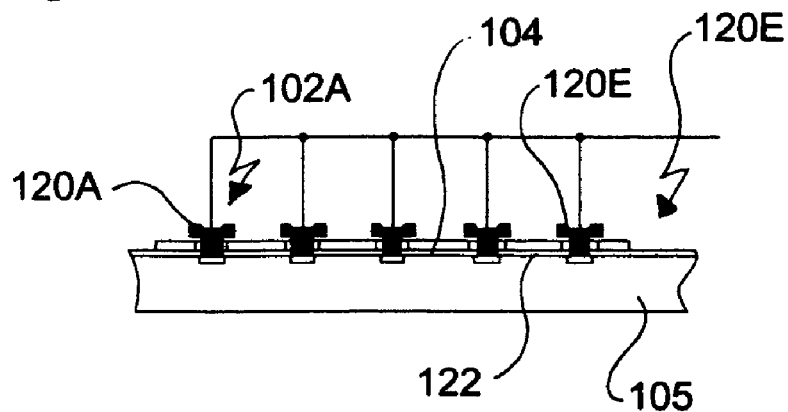
FIG. 5 shows a vertical sectional view through the photonic mixer device shown in FIG. 4, along the line B-B'.

FIG. 5 shows a lateral sectional view through the photonic mixer device represented in FIG. 4, along the line B-B'. It is clearly to be recognized that the electrode sections 102A to 102E project into the area of the modulation gates 104, the modulation gates being electrically isolated from the electrode sections 102A to 102E and their contacts 120A to 120E respectively, or being at a distance from them. The sectional view also clearly shows that the modulation gate 104 is separated by a silicon oxide layer 122 from the p-doped silicon substrate lying beneath it. The silicon oxide layer 122 serves as electrical isolation between the modulation gate 104 and the silicon substrate 105.

Figure 6:
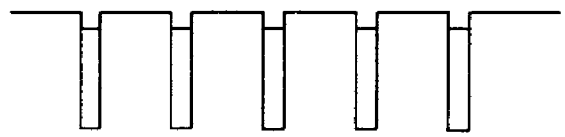
FIG. 6 shows the potential distribution of the photonic mixer devices shown in FIGS. 2 and 4, along the lines A-A'.

FIG. 6 shows the potential pattern in the two photonic mixer devices represented in FIGS. 2 and 4 along the lines A-A'. It is clear that the electrode sections of the readout electrodes 1, 2, 101, 102, because of their positive bias voltage, form potential wells with which the photo-generated electrons can be trapped.

Figure 7:
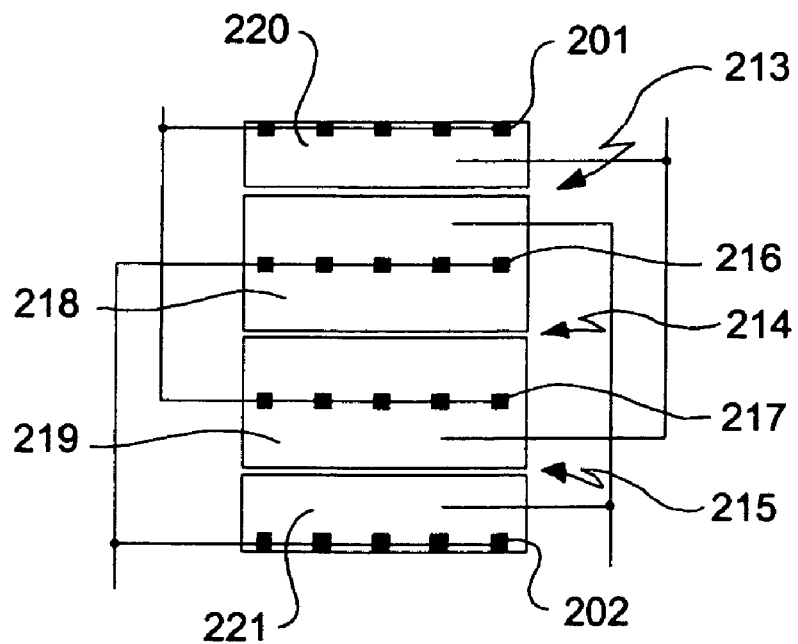
FIG. 7 shows a view from above onto a third version of the photonic mixer device according to the invention.

FIG. 7 shows a photonic mixer device comprising three mixer elements 213, 214, 215. Each of the mixer elements 213 to 215 has two readout electrodes 201, 202, 216, 217. Each of these readout electrodes is constructed in each case from five discrete electrode sections such as are known from FIGS. 2 and 4.

The mixer elements 213 and 215 each use a readout electrode 216 and 217 respectively jointly with the mixer element 214 arranged between these two elements. The readout electrodes 216 and 217 respectively used jointly by the mixer elements 213 and 215 are arranged in the area of two large-surface modulation gates 218 and 219. The two modulation gates 218 and 219 are each essentially twice as wide as the modulation gates of the photonic mixer devices shown in FIGS. 2 and 4. The modulation gates 218 and 219 are, just like the readout electrodes 216 and 217, each used jointly by two neighbouring photonic mixer devices. The modulation gates 218 to 221 are connected such that the respective neighbouring modulation gates are acted upon in opposite phase by the modulation signal. In each case, two of the four readout electrodes 201, 202, 216, 217 are connected to each other and read jointly. Two gates are always connected to each other which are arranged adjacent to modulation gates which are supplied with an in-phase modulation signal.

The two outer readout electrodes 201 and 202 of the detector elements 213 and 215 respectively are constructed like the readout electrodes 201 and 202 respectively shown in FIG. 4, but the whole of the readout electrodes 201 and 202 shown in FIG. 7 lie in the area of the modulation gates 220 and 221, and not just half like the modulation gates 201 and 202 in FIG. 4.

In alternative versions, unlike what is shown in FIG. 7, more than three mixer elements can also be connected to form a photonic mixer device. It is also possible to arrange two triple mixer elements from FIG. 7 next to each other on a photonic mixer device, the modulation signals of the two triple mixer elements displaying a 90° phase displacement relative to each other, with the result that the quadrature components and thus at the same time the intensity and the phase of the incident electromagnetic radiation can be recorded with a single measurement.

Figure 8A:
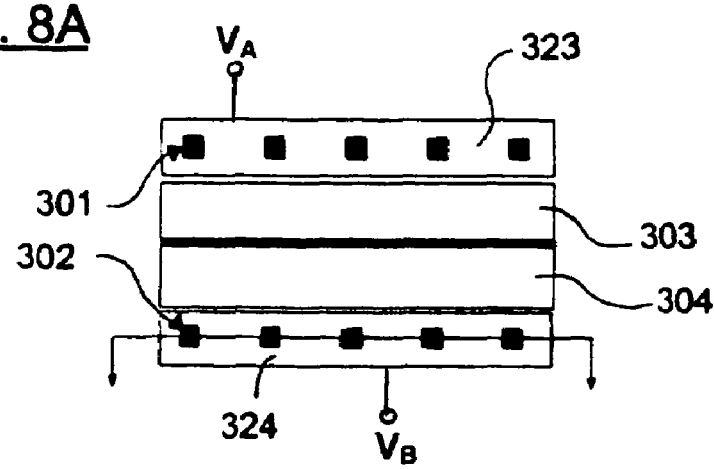
FIG. 8A shows a view from above onto a further version of the photonic mixer device according to the invention.
Figure 8B:
FIG. 8B shows the potential distribution in the photonic mixer device represented in FIG. 8a, along the line A-A'.

In FIG. 8A, a further alternative version of the photonic mixer device is represented. The readout electrodes 301 and 302 are surrounded by additional memory gates 323 and 324 which adjoin the modulation gates 303 and 304. The memory gates 323 and 324 are biased with a positive direct voltage $V_A$, $V_B$, hence the development of the potential distribution represented in FIG. 8B along the line A-A' from FIG. 8A. The operating bias voltage is chosen such that the potential well produced by the memory gate in the silicon substrate lying beneath it lies on a higher potential than the electrodes of the readout electrode 302. The memory gates form a large potential well for the photo-generated electrons. The consequence of the potential distribution in or around the readout electrodes 310 and 302 is that, when there is low illumination, the charge carriers cause a large voltage level difference, because of the small intrinsic capacity of the divided diodes. If, on the other hand, many electrons are produced when there is strong illumination of the photonic mixer device, these rapidly fill the potential wells of the readout electrodes and the further electrons are collected in the memory gates 323 and 324, where, because of the large capacity of the memory gates, they produce only a small voltage level difference per charge carrier. The result, in summary, is that a high sensitivity is available at low intensities, whereas, once a specific threshold value, predetermined by the bias voltage of the memory gates, of the intensity is exceeded this assumes a low value. In this way, the dynamic range of the photonic mixer device according to the invention is much greater than that of a photonic mixer device without memory gates.

Figure 9A:
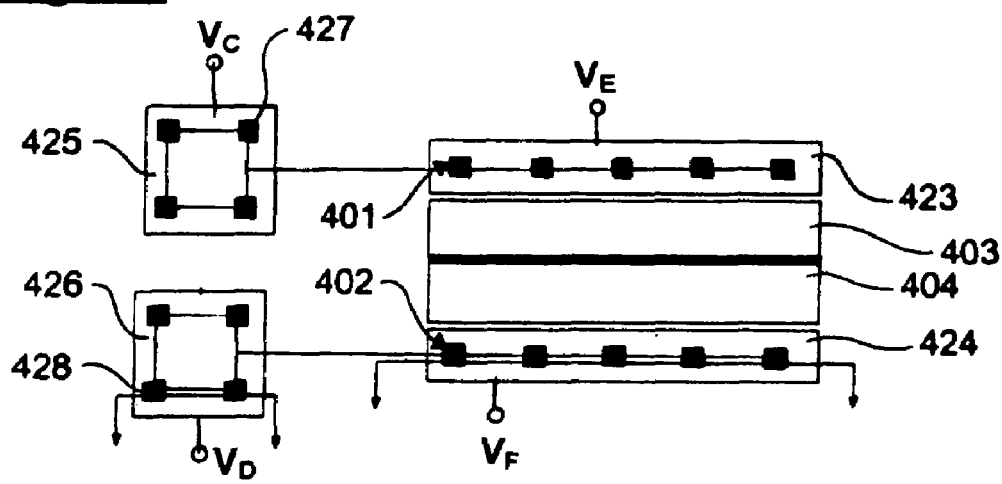
FIG. 9A shows a further version of the photonic mixer device according to the invention.

FIG. 9A shows an expanded variant of the photonic mixer device with memory gates 423 and 424, two additional memory structures with further memory gates 425 and 426 being arranged on the silicon substrate alongside the actual mixer element. The additional memory gates 425, 426 are electrically separated both from each other and from the remaining gates of the photonic mixer device. In the area of the additional memory gates 425, 426, readout electrodes 427, 428 are also arranged which are constructed from discrete, point electrodes. These readout electrodes 427, 428 are electrically connected to the readout electrodes 401 and 402 respectively. The additional memory gates 425, 426 with the readout electrodes 427, 428 are covered by a metal layer, with the result that no electromagnetic radiation falls onto them (not represented in FIG. 9A). The additional memory gates 425, 426 are likewise biased with a direct voltage $V_C$, $V_D$. The absolute value of the bias voltage $V_C$, $V_D$ of the additional memory gates 425, 426 is greater than that of the bias voltage $V_E$, $V_F$ of the memory gates 423 and 424, with the voltages $V_C$, $V_D$, $V_E$, and $V_F$ being adjustable.

Figure 9B:
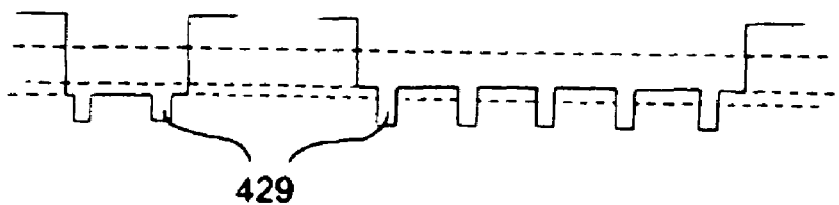
FIG. 9B shows the potential distribution in the photonic mixer device represented in FIG. 9a, along the lines B-B' and A-A'.

The mode of operation of the additional memory gates 425, 426 is clear from FIG. 9B, which represents the potential pattern along the lines B-B' and A-A' respectively from FIG. 9A. The potential wells 429 formed by the electrodes of the readout electrodes are again clearly recognizable. The additional capacity of the memory structures with the memory gates 425, 426 forms a further, third stage for the conversion efficiency of the photonic mixer device depending on the irradiated intensity. Because of the intensity-dependent conversion efficiency or sensitivity, this version of the detector shows a clearly enlarged dynamic range.

Figure 10:
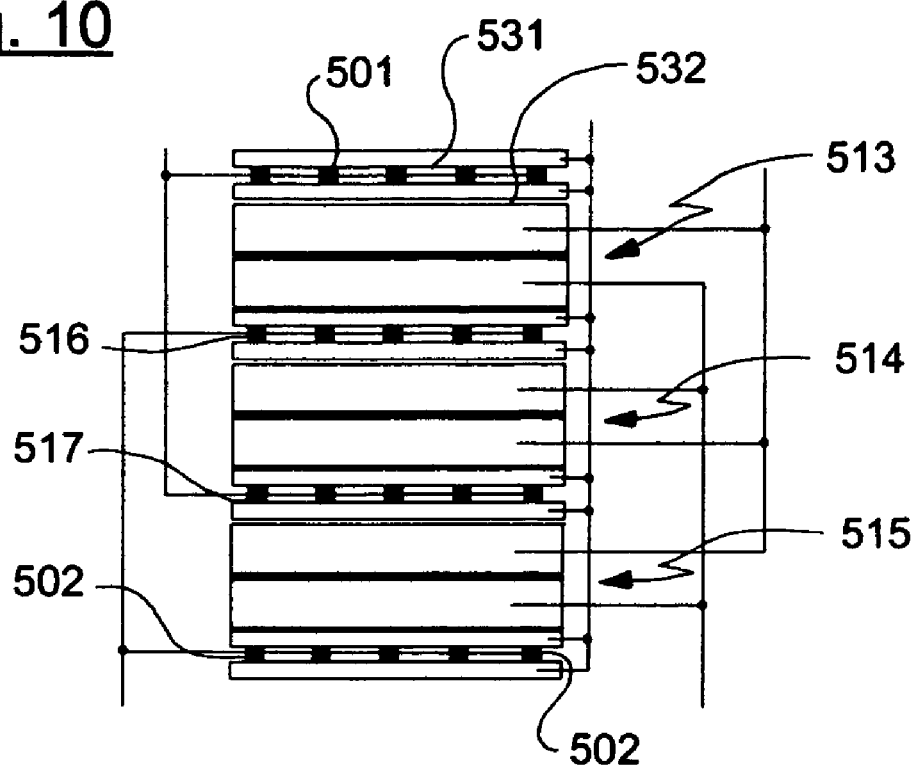
FIG. 10 shows another version of the photonic mixer device according to the invention, from above.
Figure 11:
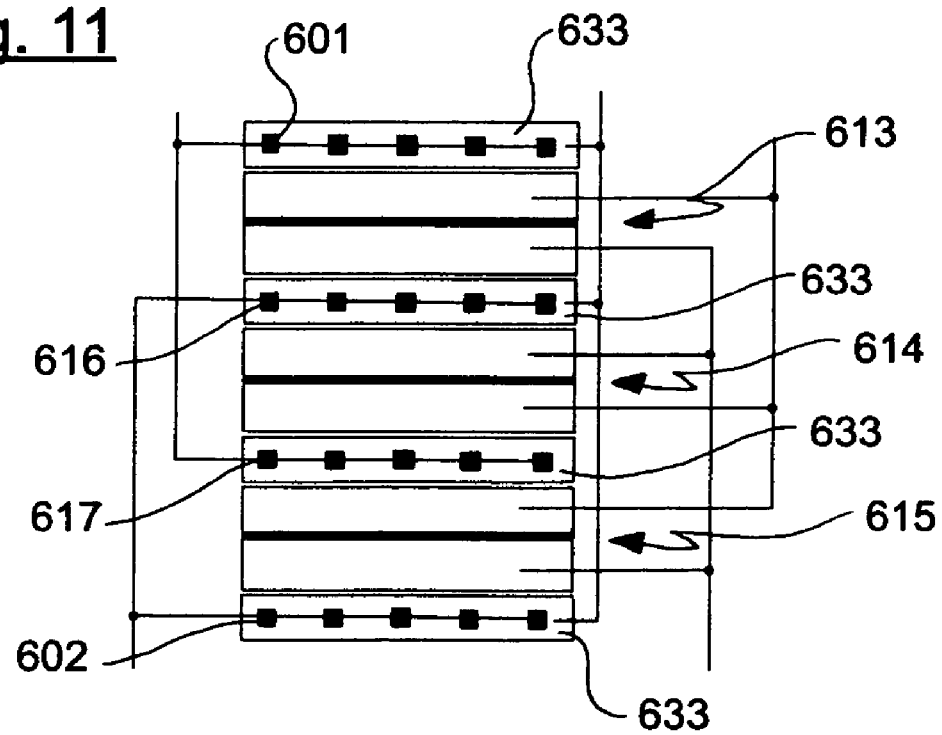
FIG. 11 shows a view from above onto a version of the photonic mixer device according to the invention.

FIGS. 10 and 11 show two versions for the integration of three detector elements 513 to 515 and 613 to 615 respectively in each case to a photonic mixer device, the readout electrodes 501, 502, 516, 517 and 601, 602, 616, 617 respectively each being surrounded by a memory gate. The two versions differ in that, in the case of the variant shown in FIG. 10, the memory gates are provided in the form of two narrow strips 531, 532 between the read-out electrodes and the respective associated modulation gates, whereas in the case of the variant shown in FIG. 11 the readout electrodes are arranged inside a wider memory gate 633.

The memory gates 323, 324, 423, 424, 531, 532, 633 represented in FIGS. 8A, 9A, 10 and 11, because of their constant bias voltage, effect a reduction of the electric side-to-side crosstalk between the modulation gates 303, 304, 403, 404 and the readout electrodes 301, 302, 401, 402, 501, 502, 516 and 517. In this way, the readout electrodes are completely decoupled from the disruptive influences of the high-frequency modulation voltage at the modulation gates 303, 304, 403, 404.

The invention claimed is:

1. Photonic mixer device for receiving incident electromagnetic radiation includes a photosensitive layer (105) responsive to the incident electromagnetic radiation, at least two modulation gates (3, 4, 103, 104, 203, 204, 303, 304, 403, 404) and at least two readout electrodes (1, 2, 101, 102, 201, 202, 301, 302, 401, 402, 501, 502, 601, 602) connected to the photosensitive layer, the modulation gates (3, 4, 103, 104, 203, 204, 303, 304, 403, 404) being able to be connected to a modulation device which raises and lowers the potential of the modulation gates relative to one another and relative to a constant potential of the readout electrodes corresponding to a desired modulation function, characterized in that the readout electrodes (1, 2, 101, 102, 201, 202, 301, 302, 401, 402, 501, 502, 601, 602) each have at least two discrete electrode sections (1A-1E, 2A-2E) arranged at a distance alongside each other, characterized in that at least two memory gates (323, 324) are provided which surround the readout electrodes (301, 302).

2. Photonic mixer device according to claim 1, characterized in that the memory gates (323, 324, 423, 424) are strip-shaped.

3. Photonic mixer device according to claim 1, characterized in that the memory gates (323, 324, 423, 424) are covered by a material that is not transparent for the incident electromagnetic radiation.

4. Photonic mixer device according to claim 1, characterized in that the memory gates (323, 324, 423, 424) are electrically isolated from the readout electrodes (301, 302, 401,402).

5. Photonic mixer device according to claim 1, characterized in that the memory gates (323, 324, 423, 424) are electrically isolated from the photosensitive layer.

6. Photonic mixer device according to claim 1, characterized in that the memory gates (323, 324, 423, 424) are connected to an adjustable voltage source.

7. Photonic mixer device according to claim 1, characterized in that the memory gates (323, 324, 423, 424) are biased with a voltage.

8. Photonic mixer device according to claim 1, characterized in that the memory gates (323, 324, 423, 424, 531, 532, 633) each form a separation gate.

9. Photonic mixer device according to claim 1, characterized in that the memory gates (323, 324, 423, 424) lie on a different potential from the readout electrodes (301, 302, 401, 402).

10. Photonic mixer device according to claim 1, characterized in that two neighbouring mixer elements (613, 614, 615) have a common memory gate (633).

11. Photonic mixer device according to claim 1, characterized in that the photonic mixer has at least one memory structure.

12. Photonic mixer device according to claim 11, characterized in that each memory structure has at least one readout electrode (427, 428) with a memory gate (425, 426) surrounding each readout electrode wherein the readout electrodes (427, 428) of each memory structure have discrete electrode sections electrically connected to each other, wherein the discrete electrode sections of the readout electrodes (427, 428) are electrically isolated from each memory gate (425, 426), wherein each memory structure is covered by a layer that is not transparent for the incident electromagnetic radiation, and wherein the readout electrodes (427, 428) of each memory structure are electrically connected to the readout electrodes (401,402) of the mixer elements.

13. Photonic mixer device according to claim 12, characterized in that two memory structures are provided per mixer element.

14. Photonic mixer device according to claim 12, characterized in that two neighbouring mixer elements of the adjacent mixer elements have a common memory structure.

15. Photonic mixer device according to claim 12, characterized in that the memory gates (425, 426) of each memory structure are connected to a second adjustable voltage source.

16. Photonic mixer device according to claim 12, characterized in that the memory gates (423, 424) of each adjacent mixer element lie on a different potential from the memory gates (425, 426) of each memory structure.

17. Photonic mixer device according to claim 12, characterized in that the memory gates (425, 426) of each memory structure structures lie on a lower potential than the memory gates (423, 424) of each adjacent mixer element and lie on a higher potential than the readout electrodes (401, 402) of each adjacent mixer element.

18. Photonic mixer device according to claim 7, characterized in that the voltage is a positive voltage.

19. Photonic mixer device according to claim 7, characterized in that the voltage is a negative voltage.

* * * * *

UNITED STATES PATENT AND TRADEMARK OFFICE
CERTIFICATE OF CORRECTION

PATENT NO. : 7,361,883 B2
APPLICATION NO. : 11/098728
DATED : April 22, 2008
INVENTOR(S) : Zhangping Xu et al.

It is certified that error appears in the above-identified patent and that said Letters Patent is hereby corrected as shown below:

Column 3, line 22, insert -- length of the -- before "discrete".
Column 12, line 17, delete "structures".

Signed and Sealed this

Twenty-second Day of July, 2008

JON W. DUDAS
*Director of the United States Patent and Trademark Office*